(12) United States Patent
Peng et al.

(10) Patent No.: US 7,760,008 B2
(45) Date of Patent: Jul. 20, 2010

(54) DIGITAL TRIMMING IN A MICROELECTRONIC DEVICE

(75) Inventors: Jia Peng, Singapore (SG); Kwee Chong Chang, Singapore (SG); Shan Jiang, Beijing (CN)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 48 days.

(21) Appl. No.: 12/259,361

(22) Filed: Oct. 28, 2008

(65) Prior Publication Data
US 2010/0105155 A1   Apr. 29, 2010

(51) Int. Cl.
*H01H 37/76* (2006.01)
(52) U.S. Cl. ....................................... 327/525
(58) Field of Classification Search ........................ None
See application file for complete search history.

(56) References Cited
U.S. PATENT DOCUMENTS
2005/0254106 A9 * 11/2005 Silverbrook et al. ........ 358/539
2007/0016835 A1 * 1/2007 Hronik et al. ............... 714/727
2007/0046309 A1 * 3/2007 LaBerge ..................... 324/765

* cited by examiner

*Primary Examiner*—Charles D Garber
*Assistant Examiner*—Andre' C Stevenson

(57) ABSTRACT

Digital trimming logic is included in a microelectronic device of a type that produces an output signal in response to an input signal and a threshold signal. Trimming logic values are produced in response to a clock signal that is applied to the device in a trimming mode. The clock signal can be applied to a device pin that is used in normal operation to provide an output signal, thus allowing the pin to serve a dual function. The trimming logic changes the trimming logic value in response to the clock signal until the trimming logic value reaches a trim value at which the threshold signal is substantially equal to the input signal. The trimming logic then stores the trim value in a non-volatile memory and enters a locked mode in which further trimming is prevented and the device is ready for normal operation.

10 Claims, 5 Drawing Sheets

DIGITAL TRIMMING IN A MICROELECTRONIC DEVICE

BACKGROUND

An optical coupler or "opto-coupler" (also referred to as an optical isolator or opto-isolator) is a type of microelectronic device in which a digital electrical input signal is converted to an optical signal, which is then detected to convert it back to a digital electrical output signal. An opto-coupler typically includes a light source such as light-emitting diode for converting the input signal to an optical signal, a light detector such as a photodiode for converting the optical signal to an electrical signal, and electronic circuitry associated with the foregoing elements, all formed on one or more semiconductor chips or dies contained within a device package. The device package has pins, i.e., electrical contacts, for the input and output signals.

In an opto-coupler designed for use in digital circuitry, it is desirable for the output signal to be as sensitive as possible to a change or bit transition in the input signal. Accordingly, it is desirable for the output signal to respond to the minimum or threshold signal level that results in the light source turning on or off. The output signal should thus transition between a digital "0" and a digital "1" as soon as the light source input signal reaches the minimum or threshold current necessary to turn it on or off. The sensitivity of an opto-coupler is difficult to control with great precision due to uncontrollable variations in semiconductor fabrication process parameters, materials, and the device assembly process (e.g., optical alignment between the light source and detector).

Trimming has been employed to adjust sensitivity or other device parameters of opto-couplers and other analog or partly analog devices so that a device parameter falls within a predetermined or manufacturer-specified tolerance. Trimming refers to a process of adjusting one or more analog electronic elements that affect the parameter sought to be adjusted. For example, a resistance can be adjusted to improve sensitivity.

Trimming can be performed before or after the device is assembled. For example, during the integrated circuit chip manufacturing process, after the integrated circuits have been fabricated on a wafer but before dicing the wafer into individual chips or dies (a stage sometimes referred to as wafer-level), electrical probes can be used to apply input signals to the circuitry on the wafer, read output signals, and trim the circuitry accordingly. By momentarily applying a high voltage to a fuse, i.e., a short metal link, formed on the wafer between a resistive element and circuitry to be trimmed, the fuse can be removed or transformed from an electrically closed state to an electrically open state, thereby altering the resistance experienced by the circuitry to be trimmed. Removing a fuse can provide fine changes in resistance, on the order of one ohm or less.

Analog integrated circuitry can also be trimmed after the device has been manufactured, using digital trimming logic included in the circuitry itself. The trimming logic can include non-volatile memory in which trimming values are stored. When the device is used in normal operation, the trimming values are read out of the memory and applied to circuit elements that affect parameters of the analog circuitry.

SUMMARY

Embodiments of the present invention relate to using digital trimming logic to trim an assembled microelectronic device of a type that produces an output signal in response to an input signal and a threshold signal. In an exemplary embodiment, a microelectronic device includes trimming logic that produces trimming logic values in response to a clock signal that is applied to the device in a trimming mode. Suitable test equipment can be used to apply the clock signal to a pin, pad or other portion of the microelectronic device that is used in normal operation to provide an output signal. The term "normal operation" refers to operation of the device for its primary purpose or function. For example, in an embodiment in which the microelectronic device is an opto-coupler, the normal operation of the opto-coupler involves converting an input signal to an optical signal and detecting the optical signal to convert it to a digital electrical output signal. The digital electrical output signal is then output on an associated pin. That is, when the device is in a normal operational mode, the pin serves as an output for the converted signal. However, when the device is in a trimming mode, the pin serves as an input for the clock signal. This dual-purpose use of the pin minimizes the number of device input/output pins.

In trimming mode, the trimming logic changes (e.g., increments or decrements) the trimming logic value in response to the clock signal until the trimming logic value reaches a trim value at which the trimming signal causes the threshold signal and input signal to be substantially equal in level to each other. The trimming logic then stores the trim value in a non-volatile memory and enters a locked mode in which further trimming is prevented and the device is ready for normal operation. In normal operation, the trim value is output from the non-volatile memory to the trimming signal generator. In response, the trimming signal generator produces a trim signal that affects how the output signal is produced in response to the input signal and threshold signal. For example, the signal generator can produce a trim current that affects the behavior of the circuitry that produces the threshold signal in a manner that improves sensitivity. An opto-coupler device, for example, can be trimmed so that it is more precisely sensitive to the minimum input signal level necessary to turn the light source on.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 1:
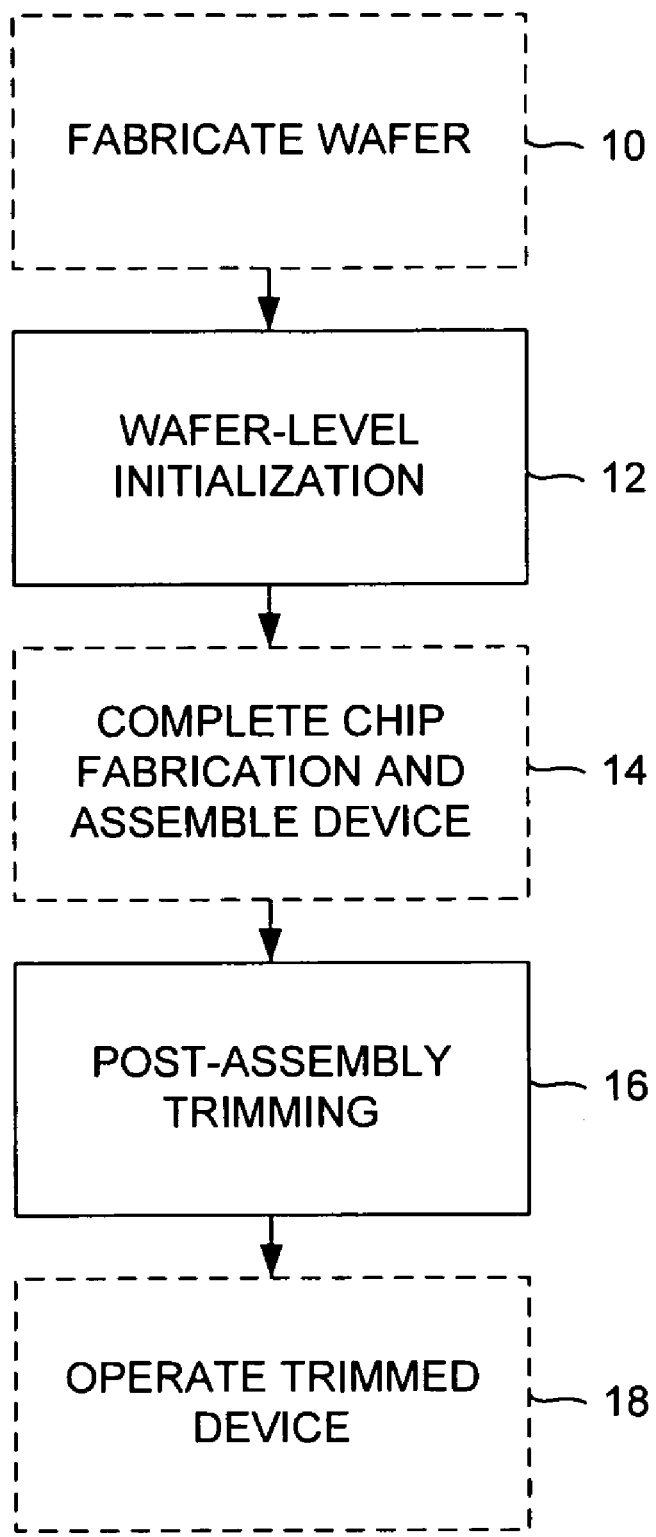
FIG. 1 is a flow diagram illustrating a method for trimming a microelectronic device, in accordance with an exemplary embodiment of the invention.

As illustrated in FIG. 1, in an exemplary embodiment of the invention, a method for trimming a microelectronic device includes, as described below in further detail: fabricating a semiconductor wafer, as indicated by block 10; wafer-level initialization, as indicated by block 12; completing the manufacture of the device by processing the wafer into individual integrated circuit chips and assembling one or more chips into a completed microelectronic device, as indicated by block 14; and post-assembly trimming, as indicated by block 16. Once the device has been trimmed, it can be operated normally, as indicated by block 18.

Figure 2:
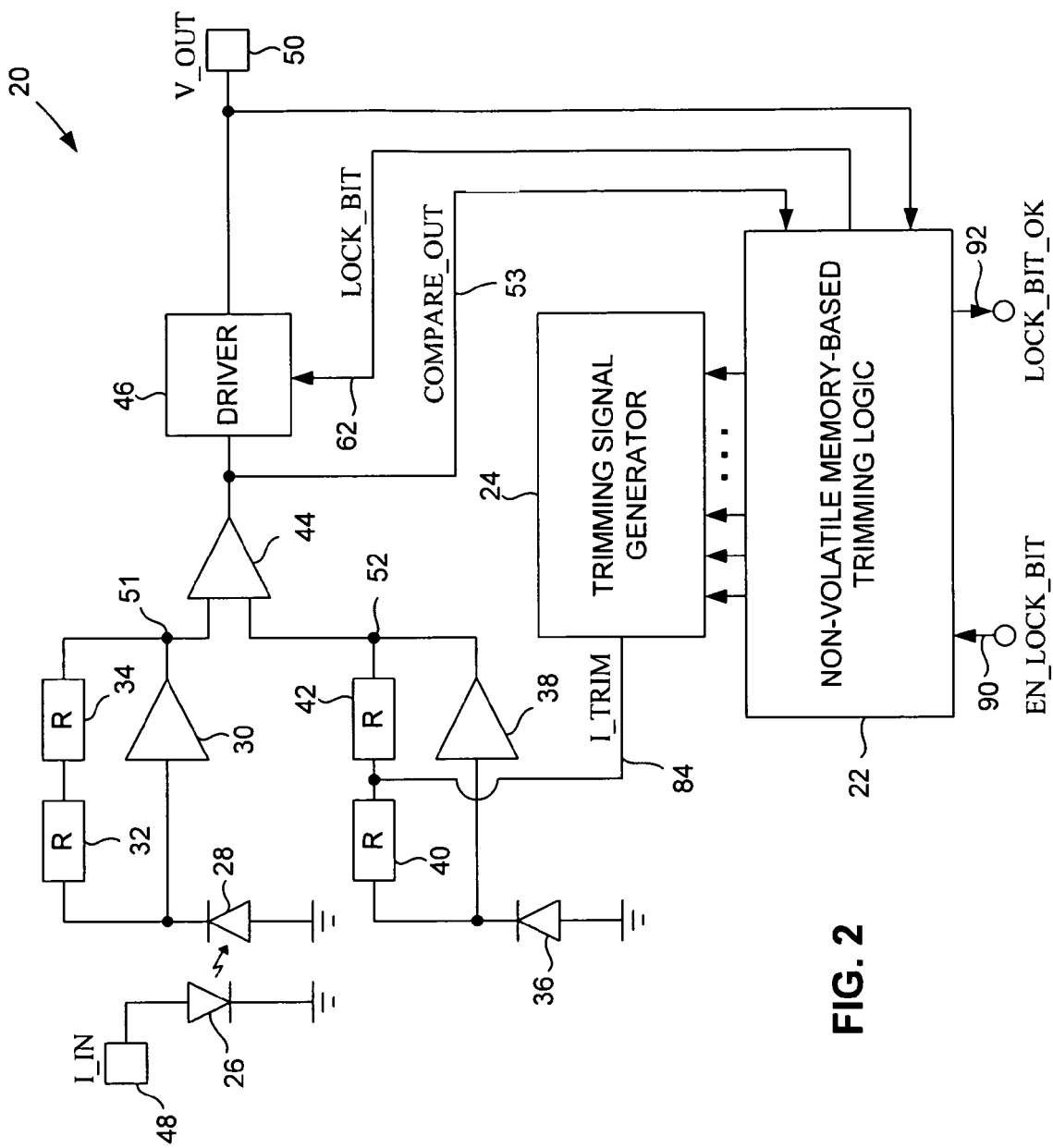
FIG. 2 is a block diagram of a microelectronic device, in accordance with the exemplary embodiment.

As illustrated in FIG. 2, in the exemplary embodiment the microelectronic device can be an opto-coupler 20. Opto-coupler 20 includes trimming circuitry comprising trimming logic 22 and a trimming current signal generator 24. The trimming circuitry is used to trim opto-coupler 20 in the manner described below. In addition to the trimming circuitry, the following elements define the normal operational portion of opto-coupler 20, i.e., the elements that enable it to perform the opto-coupling function: a light source 26 such as a light-emitting diode; a light detector or photodetector 28; a first amplifier 30; first and second resistors 32 and 34; a diode 36; a second amplifier 38; third and fourth resistors 40 and 42; a comparator 44; and a driver 46. Although not shown for purposes of clarity, the foregoing elements can be embodied in one or more integrated circuit chips that are packaged in a conventional manner and that receive input signals and provide output signals via package input/output (I/O) pins in the conventional manner. The I/O pins include a pin 48 associated with the signal that is input to opto-coupler 20 (i.e., the signal to be optically coupled), and a pin 50 associated with the signal that is output by opto-coupler 20.

In normal opto-coupler operation, the circuitry comprising diode 36, second amplifier 38, and third and fourth resistors 40 and 42 produces a reference voltage or threshold voltage at node 52. A current is input to opto-coupler 20 via pin 48, which drives light source 26. Photodetector 28 produces a current in response to detected light from light source 26. The output of photodetector 28 is amplified by the circuitry comprising amplifier 30 and resistors 32 and 34. Comparator 44 compares this amplified signal with the threshold voltage signal. If the amplified signal level at node 51 exceeds the threshold voltage signal level at node 52, comparator 44 produces a logic "1" or high "COMPARE_OUT" signal 53, which driver 46 outputs from opto-coupler 20 via pin 50. Opto-coupler 20 can also include pins (not shown for purposes of clarity) through which opto-coupler can be connected to power and ground potentials. Additional circuitry of any suitable type that is known to be included in typical opto-couplers or is otherwise suitable for inclusion in an opto-coupler can also be included. For example, a circuit (not shown for purposes of clarity) can be included that generates a suitable "power-on-reset" pulse when power is applied to opto-coupler 20.

The above-described opto-coupler 20 can be trimmed in the manner described below so that its sensitivity to the minimum input current level necessary to turn light source 26 on can be optimized. Trimming logic 22 and trimming current signal generator 24 are shown in further detail in FIG. 3. Trimming logic 22 includes a counter 52, a parallel-to-serial data converter 54, non-volatile memory (NVM) 56, a selector 58, and memory timing logic 60. As described in further detail below with regard to the exemplary trimming method, counter 52 counts in response to a clock signal. The count is provided to both parallel-to-serial data converter 54 and selector 58. The serial output of parallel-to-serial data converter 54 is provided to a serial input of NVM 56. As described below, data can be read out of NVM 56 in parallel format. Selector 58 selects one of the count and the data read out of NVM 56 in response to a LOCK_BIT signal 62 that is also read out of NVM 56. The selected value is referred to herein for purposes of convenience as the trimming logic value.

Trimming current signal generator 24 includes a current source 64 and transistors 66, 68, 70, 72, 74, 76, 78, 80, 82, etc. As indicated by the ellipsis symbol (" . . . ") in FIG. 3, trimming current signal generator 24 can include any suitable number of such transistors, each of which (with the exception of transistor 82) corresponds to a bit of the trimming logic value that trimming logic 22 outputs. Each of the n bits of the trimming logic value, G0 through Gn, is applied to the gate terminal of one of transistors 66, 70, 74, 78, etc., and thus can turn that transistor on or off. Each of transistors 66, 70, 72, 74, 78, etc., is paired with a respective transistor 68, 72, 76, 80, etc., in an arrangement that generates a current when the transistor is turned on. By turning corresponding ones of transistors 66, 68, 70, 72, 74, 76, 78, 80, 82, etc., on in response to bits of the trimming logic value, trimming current signal generator 24 generates an I_TRIM current signal 84 that corresponds to the trimming logic value. Although in the exemplary embodiment, trimming current signal generator 24 uses current to adjust or trim the threshold signal, in other embodiments a trimming signal generator can use any other suitable parameter, such as voltage.

A wafer that includes or embodies the above-described circuitry can be fabricated in a conventional manner, as known in the art. Therefore, the wafer fabrication indicated by block 10 in FIG. 1 is not described herein in further detail. As will be understood by persons skilled in the art, the wafer can include multiple copies or instances of the above-described circuitry, such that after fabrication and wafer-level initialization indicated by blocks 10 and 12, respectively, in FIG. 1, the wafer can be diced into individual integrated circuit chips or dies. The dies can then be assembled into corresponding individual opto-couplers 20 (only one of which is described herein for purposes of clarity), and each opto-coupler 20 can be trimmed as indicated by block 16 of FIG. 1.

Figure 3:
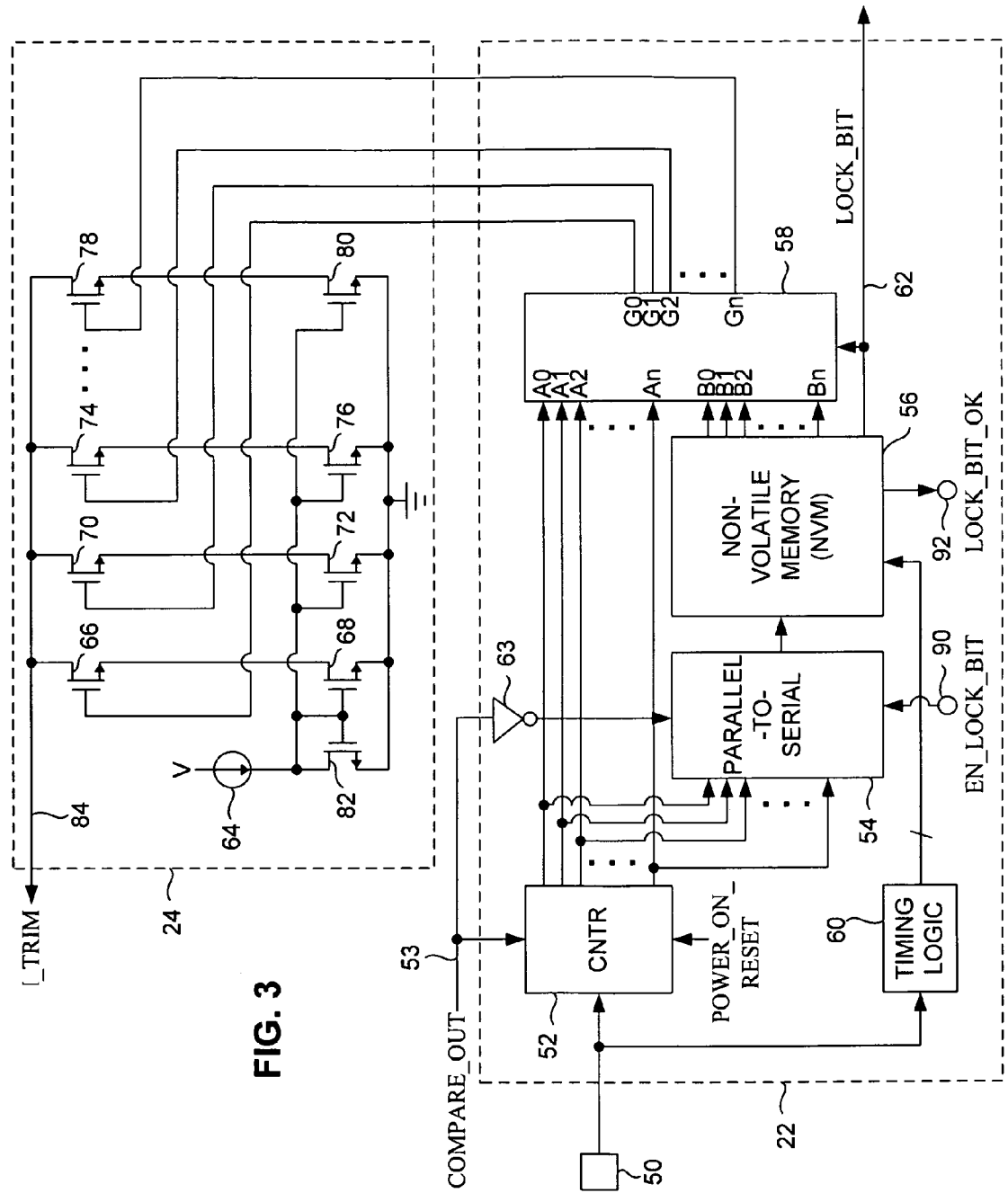
FIG. 3 is a block diagram of a trimming portion of the microelectronic device shown in FIG. 2.
Figure 4:
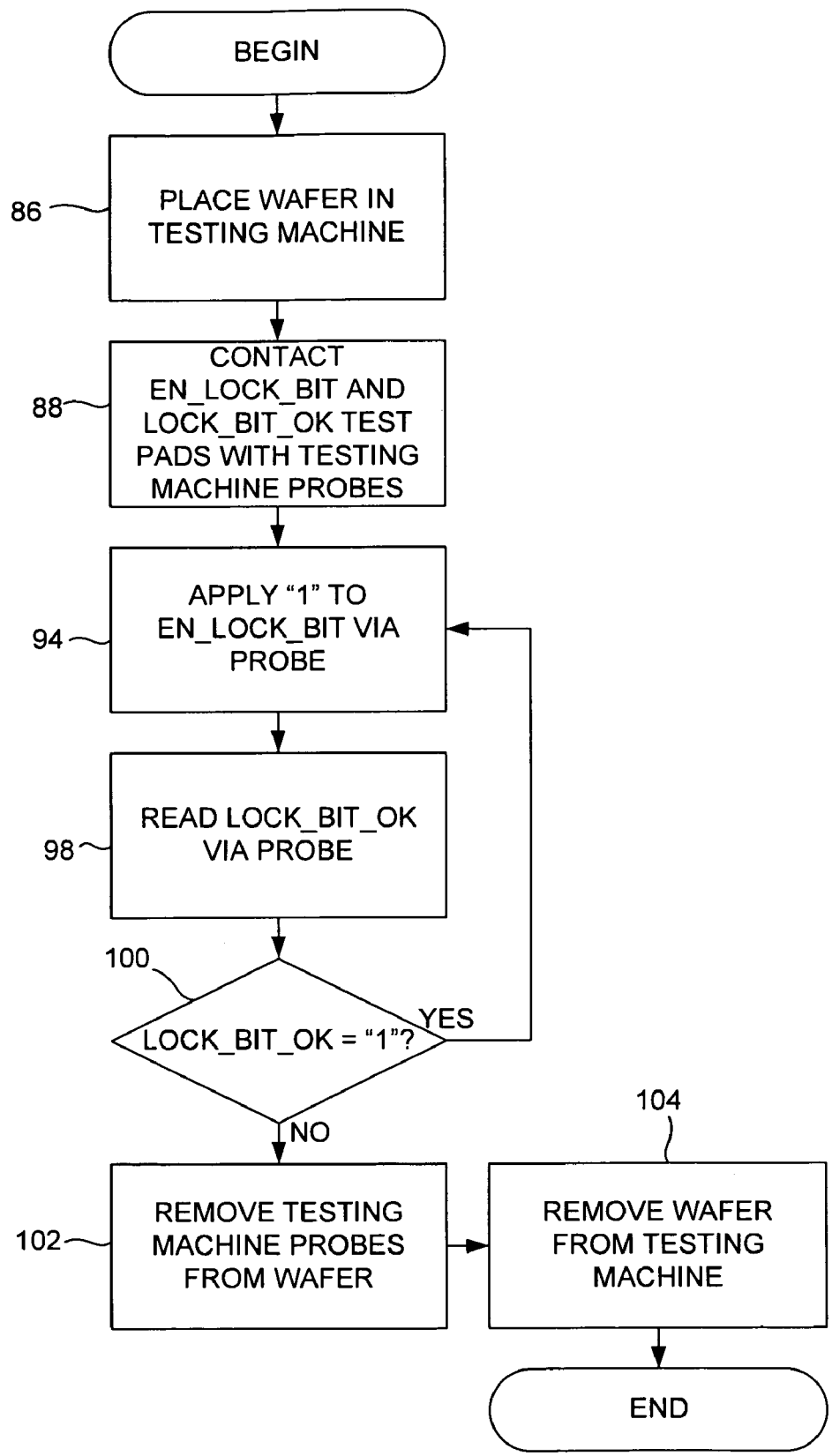
FIG. 4 is a flow diagram illustrating a wafer-level portion of the method illustrated in FIG. 1.

The wafer-level initialization indicated by block 12 of FIG. 1 is shown in further detail in FIG. 4. As indicated by block 86, a semiconductor wafer that has been at least partially fabricated to define one or more opto-coupling integrated circuits having the circuitry shown in FIGS. 2-3 is placed in a testing machine (not shown for purposes of clarity). Suitable wafer testing machines that can apply signals to wafer circuitry and read signals produced by wafer circuitry via probes are well known in the art and therefore not described in further detail herein. Similarly, the general manner in which such wafer testing can be performed using such machines is not described herein, as it is well understood by persons of ordinary skill in the art to which the invention relates. Broadly described, such testing machines have probes that can be brought into physical contact with pads or areas on the wafer surface. The testing machine has circuitry that can be programmed to apply stimulus signals via the probes and read signals via the probes that the wafer circuitry produces in response to the stimulus signals. The testing machine applies power and ground signals to corresponding points on the wafer so that the wafer circuitry is powered during the initialization process described below.

As indicated by block 88, following placement of the wafer in the testing machine, the testing machine causes a probe to make contact with an EN_LOCK_BIT (enable lock bit) testing pad 90 and a LOCK_BIT_OK testing pad 92, which are shown in conceptual or schematic form in FIGS. 2 and 3. As indicated by block 94, the testing machine then applies a logic "1" or high level signal to EN_LOCK_BIT testing pad 90 via the probe contact. Applying this signal to EN_LOCK_BIT testing pad 90 causes parallel-to-serial data converter 54 to set or initialize LOCK_BIT signal 62 to a logic "1" or high level in NVM 56. In response to the logic "1" or high level LOCK_BIT signal 62, selector 58 selects the output of counter 52 instead of the output of NVM 56. The logic "1" or high level of LOCK_BIT signal 62 also causes driver 46 to set its output to a high-impedance state, thus preventing driver 46 from driving pin 50 (FIG. 2).

Referring again to FIG. 4, as indicated by blocks 98 and 100, the testing machine reads the value of LOCK_BIT_OK via the probe in contact with testing pad 92 (FIG. 3) and determines whether it has a value of logic "1" or high. If LOCK_BIT_OK has a value of logic "1" or high, then the testing machine continues to apply the clock signal as indicated by block 96. If LOCK_BIT_OK has a value of logic "0" or low, then initialization has been completed. As a result of this initialization, LOCK_BIT signal 62 has a value of logic "1" or high, and the remaining outputs of NVM 56 have a value of logic "0" or low.

After the above-described wafer-level initialization, the testing machine can disengage the probes from the wafer, and the wafer can be removed from the testing machine as indicated by blocks 102 and 104, respectively. Note that as NVM 56 is non-volatile, its output continues to reflect the data stored in it, including the value of LOCK_BIT signal 62, even after the wafer is removed from the testing machine and the wafer no longer receives a power signal.

Referring briefly again to FIG. 1, following the above-described wafer-level initialization, the wafer fabrication process can be completed. For example, the wafer may undergo additional processing and dicing into individual integrated circuit chips, each of which includes the circuitry shown in FIGS. 2 and 3. As indicated by block 14, each such chip can then be combined with other elements to form or assemble a completed opto-coupler 20 (i.e., a completed microelectronic device) by, for example, mounting it in a suitable package (not shown) having the above-referenced pins 48, 50, etc. Then, as indicated by block 16, post-assembly trimming can be performed on the assembled opto-coupler 20.

Figure 5:
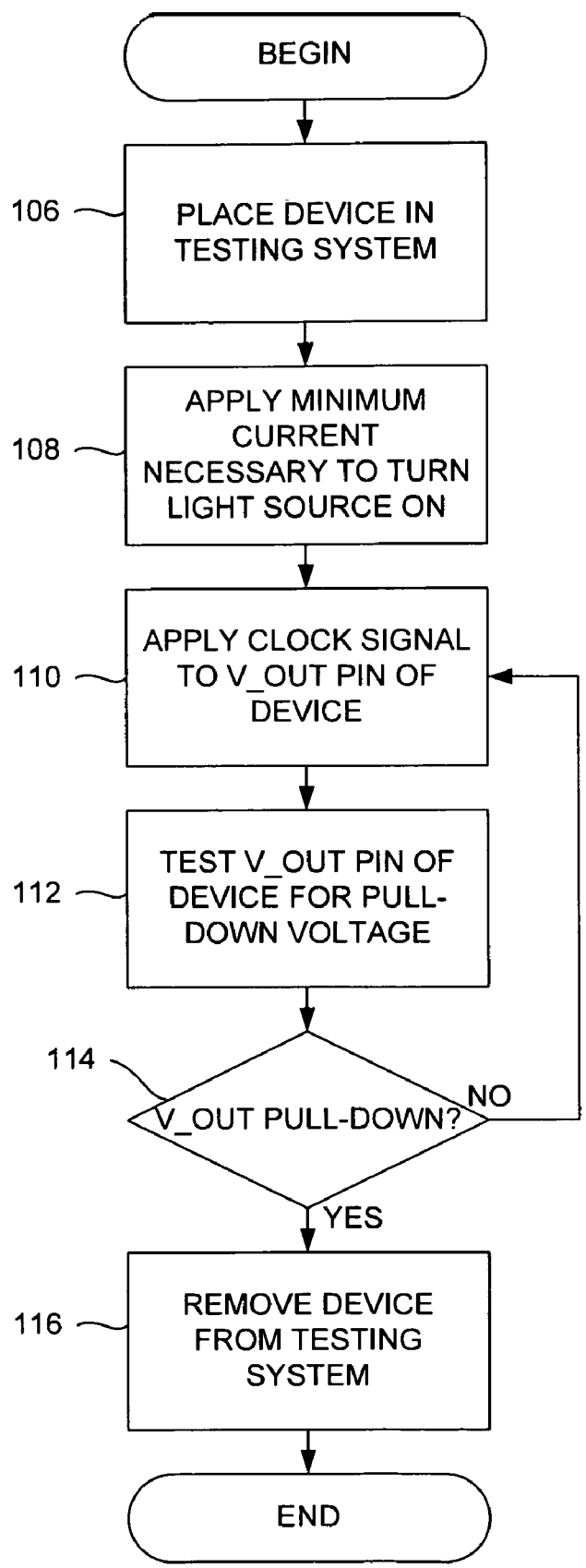
FIG. 5 is a flow diagram illustrating a post-device-assembly-level portion of the method illustrated in FIG. 1.

An exemplary method for trimming (referenced in block 16 of FIG. 1) the assembled opto-coupler 20 is shown in FIG. 5. A testing system (not shown) that is analogous to the probe-based testing machine described above with regard to wafer-level initialization can be used to perform this post-assembly trimming. The testing system differs from a wafer testing machine in that the completed opto-coupler 20 or other completed microelectronic device is mounted in the testing system such that pins 48, 50, etc., make contact with electrical contacts of the testing system. Such testing systems for testing assembled microelectronic devices are well known and therefore not described herein in further detail. As indicated by block 106, opto-coupler 20 is mounted in the testing system, which supplies power and ground signals to the appropriate pins (not shown).

As indicated by block 108, the testing system applies a current (I_IN) to pin 48 that is the minimum current that can cause light source 26 (FIG. 2) to turn on. Photodetector 28 produces a current in response to detected light from light source 26. The output of photodetector 28 is amplified by the circuitry comprising amplifier 30 and resistors 32 and 34. Comparator 44 compares this amplified signal with the threshold voltage signal at node 52. If the amplified signal level at node 51 exceeds the threshold voltage signal level at node 52, comparator 44 produces a logic "1" or high "COMPARE_OUT" signal 53. As described below, the trimming circuitry comprising trimming logic 22 and trimming current signal generator 24 adjusts or trims the threshold voltage signal to maximize sensitivity of opto-coupler 20 to the minimum current that can cause light source 26 to turn on.

As indicated by block 110, the testing system also applies a clock signal to pin 50. In normal operation of opto-coupler 20, pin 50 provides the output signal (V_OUT). However, during trimming, pin 50 serves a different purpose: to receive a clock signal. Note that during trimming, driver 46 is held in a high-impedance state by LOCK_BIT signal 62, preventing driver 46 from driving pin 50, and thereby allowing pin 50 to serve as an input. In response to the clock signal, counter 52 begins counting. As LOCK_BIT signal 62 causes selector 58 to select the output of counter 52, the trimming logic value is the same as the count. Thus, as the count increases, the trimming logic value that is applied to trimming current signal generator 24 increases. The increasing trimming logic value in turn causes trimming current signal generator 24 to increase I_TRIM current signal 84.

With further reference to FIG. 2, the increasing I_TRIM current signal 84 causes the voltage at node 52 to increase until it equals or exceeds the voltage at node 51, at which time comparator 44 produces a logic "1" or high level COMPARE_OUT signal 53. In response to COMPARE_OUT signal 53 changing to a logic "1" or high level, counter 52 is disabled, i.e., stopped from counting. Similarly, in response to COMPARE_OUT signal 53 changing to a logic "1" or high level, parallel-to-serial data converter 54, which receives the complement of COMPARE_OUT signal 53 via inverter 63, is activated. Activating parallel-to-serial data converter 54 causes it to convert the parallel-format data at its input to serial-format data at its output. Timing logic 60 causes NVM 56 to store the serial-format data and, when the data has been stored, to change LOCK_BIT signal 62 to a logic "0" or low level. In response to LOCK_BIT signal 62 changing to a logic "0" or low level, selector 58 selects the output of NVM 56 instead of the output of counter 52 as the trimming logic value.

As indicated by blocks 112 and 114, the testing system can determine whether pin 50 (V_OUT) is being driven by driver 46 or is in a high-impedance state. If pin 50 is not being driven, indicating that LOCK_BIT signal 62 has a value of logic "1" or high and thus that trimming has not completed, then the testing system continues to apply the clock signal. If pin 50 is being pulled down, indicating that LOCK_BIT signal 62 has a value of logic "0" or low, then trimming has completed, and opto-coupler 20 can be removed from the testing system as indicated by block 116.

Once trimming has been completed, opto-coupler 20 can be operated normally, as indicated by block 18 of FIG. 1. That is, opto-coupler 20 can be included as part of other circuitry in which it is desired to optically couple one portion of the circuitry to another. In normal operation, the output of NVM 56, i.e., the trimming logic value, reflects the result of the above-described trimming method and can be referred to as the trim value. As NVM 56 is non-volatile, i.e., it does not lose the trim value or other memory contents even in the absence of power, opto-coupler 20 remains in this trimmed and locked state essentially indefinitely.

One or more illustrative embodiments of the invention have been described above. However, it is to be understood that the invention is defined by the appended claims and is not limited to the specific embodiments described.

What is claimed is:

1. A method for trimming a microelectronic device having an output signal responsive to an input signal and a threshold signal, the microelectronic device having trimming logic and a trimming signal generator, the trimming signal generator producing a trimming signal in response to a trimming logic value generated by the trimming logic, the method comprising:

applying a clock signal to a pin of the microelectronic device associated with the output signal in normal operation;

the trimming logic changing the trimming logic value in response to the clock signal until the trimming logic value reaches a trim value at which the trimming signal causes the threshold signal and input signal to be substantially equal to each other;

storing the trim value in a non-volatile memory;

locking the trimming logic when the trimming logic value reaches the trim value; and outputting the trim value from the non-volatile memory to the trimming signal generator while the trimming logic is locked.

2. The method claimed in claim 1, wherein the trimming method is performed on a packaged microelectronic device.

3. The method claimed in claim 1, further comprising:

inserting a semiconductor wafer into a probe-based test system;

applying a signal via a probe to initialize the trimming logic to an unlocked state.

4. The method claimed in claim 1, wherein the microelectronic device is an opto-coupler having a light source and a light detector, and the method further comprises:

while applying the clock signal, applying an input signal having a level at a minimum necessary to turn the light source on.

5. A microelectronic device digitally trimmable in a trimming mode, comprising:

device circuitry, the device circuitry producing in a normal operational mode an output signal on a device output signal pin in response to an input signal and a threshold signal;

trimming logic, the trimming logic producing a trimming logic value in response to a clock signal received on the device output signal pin in trimming mode;

a trimming signal generator, the trimming signal generator producing a trimming signal in response to the trimming logic value, wherein the trimming logic changes the trimming logic value in response to the clock signal until the trimming logic value reaches a trim value at which trimming signal causes the threshold signal and input signal to be substantially equal to each other;

non-volatile memory, the non-volatile memory storing the trim value; and trim output circuitry, the trim output circuitry outputting the trim value from the non-volatile memory to the trimming signal generator while the trimming logic is locked.

6. The microelectronic device claimed in claim 5, wherein the device circuitry comprises:

a light source responsive to the input signal;

a light detector optically coupled to the light source to produce a detected input signal;

threshold circuitry for producing the threshold signal, wherein the trimming signal trims the threshold signal; and a comparator for comparing the threshold signal with the detected input signal.

7. The microelectronic device claimed in claim 5, wherein the trimming signal generator comprises a plurality of transistors, each transistor coupled to a bit of the trimming logic value.

8. The microelectronic device claimed in claim 5, wherein the trim output circuitry comprises a selector having a selection input coupled to a selection bit output by the non-volatile memory.

9. The microelectronic device claimed in claim 8, wherein:

the trim logic comprises a counter; and the selector selectably couples one of an output of the counter and an output of the non-volatile memory to the trimming signal generator in response to the selection bit.

10. The microelectronic device claimed in claim 9, wherein:

the non-volatile memory has a serial data input and parallel data output; and the output of the counter is connected to the serial data input of the non-volatile memory.

* * * * *